US009698290B2

(12) United States Patent
Moon

(10) Patent No.: US 9,698,290 B2
(45) Date of Patent: Jul. 4, 2017

(54) SOLAR CELL MODULE AND METHOD OF FABRICATING THE SAME

(71) Applicant: LG INNOTEK CO., LTD., Seoul (KR)

(72) Inventor: Bong Seok Moon, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 402 days.

(21) Appl. No.: 14/355,378

(22) PCT Filed: Oct. 31, 2012

(86) PCT No.: PCT/KR2012/009027
§ 371 (c)(1),
(2) Date: Apr. 30, 2014

(87) PCT Pub. No.: WO2013/066031
PCT Pub. Date: May 10, 2013

(65) Prior Publication Data
US 2014/0246079 A1 Sep. 4, 2014

(30) Foreign Application Priority Data
Nov. 1, 2011 (KR) .................. 10-2011-0112657

(51) Int. Cl.
*H02N 6/00* (2006.01)
*H01L 31/042* (2014.01)
(Continued)

(52) U.S. Cl.
CPC ...... *H01L 31/0485* (2013.01); *H01L 31/0201* (2013.01); *H02S 40/34* (2014.12); *Y02E 10/50* (2013.01)

(58) Field of Classification Search
CPC ........... H01L 31/0201; H01L 31/02013; H01L 31/0485; H02S 40/34
See application file for complete search history.

(56) References Cited

U.S. PATENT DOCUMENTS 6,469,242 B1 * 10/2002 Kondo ..................... 136/251
2007/0056625 A1    3/2007 Higuchi et al.
(Continued)

FOREIGN PATENT DOCUMENTS

CN    101779297 A    7/2010
JP    H-0846232 A    2/1996
(Continued)

OTHER PUBLICATIONS

Chinese Office Action dated Sep. 16, 2015 in Chinese Application No. 201280065766.7.
(Continued)

*Primary Examiner* — Eli Mekhlin
(74) *Attorney, Agent, or Firm* — Saliwanchik, Lloyd & Eisenschenk

(57) ABSTRACT

Disclosed are a solar cell module and a method of fabricating the same. The solar cell module includes a substrate, a solar cell panel located on the substrate and including a plurality of solar cells, a buffer sheet on the solar cell panel, and a bus bar connected to one of the solar cells while passing through the buffer sheet. The method of fabricating a solar cell module includes forming a solar cell panel including a plurality of solar cells on a substrate, forming a buffer sheet including a bus bar connected to one of the solar cells, and locating the buffer sheet including the bus bar on the solar cell panel. The bus bar passes through the buffer sheet.

11 Claims, 2 Drawing Sheets

(51) Int. Cl.
*H01L 31/048* (2014.01)
*H01L 31/02* (2006.01)
*H02S 40/34* (2014.01)

(56) References Cited

U.S. PATENT DOCUMENTS

2008/0156365 A1* 7/2008 Scholz et al. ................. 136/251
2011/0073362 A1* 3/2011 Shimizu ......................... 174/520
2011/0088749 A1* 4/2011 Shimizu ............ H01L 31/02013
 136/244
2011/0155203 A1 6/2011 Funakoshi

FOREIGN PATENT DOCUMENTS

| JP | 11-303325 A | 11/1999 |
| KR | 10-2007-00320699 A | 3/2007 |
| KR | 10-2010-0109322 A | 10/2010 |

OTHER PUBLICATIONS

International Search Report in International Application No. PCT/KR2012/009027, filed Oct. 31, 2012.

* cited by examiner

SOLAR CELL MODULE AND METHOD OF FABRICATING THE SAME

CROSS-REFERENCE TO RELATED APPLICATIONS

This application is the U.S. national stage application of International Patent Application No. PCT/KR2012/009027, filed Oct. 31, 2012, which claims priority to Korean Application No. 10-2011-0112657, filed Nov. 1, 2011, the disclosures of each of which are incorporated herein by reference in their entirety.

TECHNICAL FIELD

The embodiment relates to a solar cell module and a method of fabricating the same.

BACKGROUND ART

A solar cell apparatus to convert light energy into electrical energy through photoelectric conversion effect has been extensively known as a device to obtain non-pollution energy contributing to the conservation of global environment.

As the photoelectric conversion effect is improved, a great number of solar cell systems having a solar cell module are installed even for home use.

In order to output power generated from the solar cell module including solar cells that generate power from the light of the sun, conductors acting as positive and negative electrodes are provided in the solar cell module, and terminals of the conductors, which serve as connectors connected to a cable of outputting current to the outside, are provided out of a photovoltaic module.

Meanwhile, in order to connect a bus bar to a junction box, a hole must be provided in a lower substrate. However, during the process of the solar cell module, the lower substrate may be broken due to variable causes such as high temperature. In addition, a hole machining tool to form a hole in the lower substrate is required, so that the fabricating time and the fabricating cost may be increased.

DISCLOSURE OF INVENTION

Technical Problem

The embodiment provides a solar cell module capable of representing improved durability and improved reliability.

Solution to Problem

According to the embodiment, there is provided a solar cell module including a substrate, a solar cell panel located on the substrate and including a plurality of solar cells, a buffer sheet on the solar cell panel, and a bus bar connected to one of the solar cells while passing through the buffer sheet.

According to the embodiment, there is provided a method of fabricating a solar cell module. The method includes forming a solar cell panel including a plurality of solar cells on a substrate, forming a buffer sheet including a bus bar connected to one of the solar cells, and locating the buffer sheet including the bus bar on the solar cell panel. The bus bar passes through the buffer sheet.

Advantageous Effects of Invention

As described above, the solar cell module according to the embodiment include the buffer sheet and the bus bar. The bus bar passes through the buffer sheet. The bus bar is provided together with the buffer sheet, so that the bus bar can be bonded to the solar cells through a laminating process. In other words, the buffer sheet and the bus bar are simultaneously formed in the solar cell module, so that the manufacturing time can be reduced.

In addition, the bus bar according to the embodiment can be connected to the connector located on the bottom surface of the lower substrate without forming a hole in the lower substrate. Accordingly, the lower substrate can be prevented from being broken due to various factors such as a high temperature in the process of the solar cell module. In addition, a hole machining tool for forming a hole in the lower substrate 100 according to the related art is omitted, so that the manufacturing time and the manufacturing cost can be reduced.

In addition, the buffer sheet can be more firmly sealed together with the lower substrate, thereby preventing water from being infiltrated into the solar cell module.

According to the method of fabricating the solar cell module of the embodiment, the solar cells having the above effects can be fabricated.

MODE FOR THE INVENTION

Figure 1:
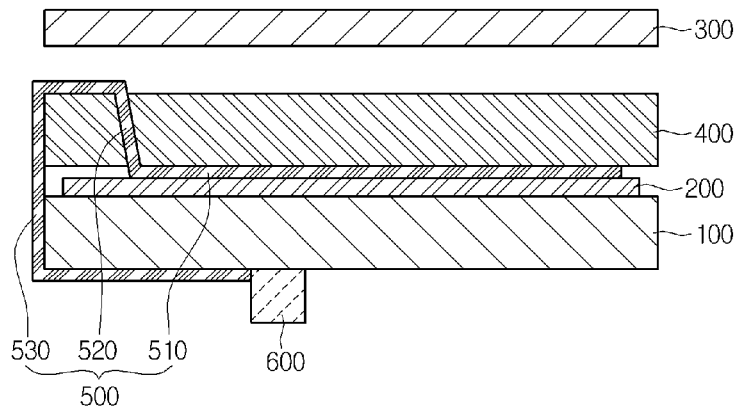
FIG. 1 is a sectional view showing a solar cell module according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer (or film), each region, each pattern, or each structure shown in the drawings may be exaggerated, omitted or schematically drawn for the purpose of convenience or clarity. In addition, the size of the layer (or film), the region, the pattern, or the structure does not utterly reflect an actual size.

Hereinafter, the embodiment will be described with reference to accompanying drawings in detail.

First, the solar cell module according to the embodiment will be described below with reference to FIG. 1. FIG. 1 is a sectional view showing the solar cell module according to the embodiment.

Referring to FIG. 1, the solar cell module includes a lower substrate 100, a solar cell panel 200, an upper substrate 300, a buffer sheet 400, a bus bar 500, and a connector 600.

The lower substrate 100 is located at the lowermost part of the solar cell module. The lower substrate 100 may support the solar cell panel 200.

The lower substrate 100 is transparent and has higher strength. The lower substrate 100 may include tempered glass.

The solar cell panel 200 is located on the lower substrate 100.

The solar cell panel 200 has a plate shape and includes a plurality of solar cells.

Solar cells may include a CIGS-based solar cell, a silicon-based solar cell, a dye-sensitized solar cell, a group II-VI compound semiconductor solar cell, or a group III-V compound semiconductor solar cell.

In addition, the solar cells may be provided on a transparent substrate such as a glass substrate.

The solar cells may be arranged in the shape of a stripe. In addition, the solar cells may be arranged in various shapes such as a matrix shape.

The upper substrate 300 is provided on the solar cell panel 200. In more detail, the upper substrate 300 is provided in opposition to the solar cell panel 200.

The upper substrate 300 is transparent and has high strength. The upper substrate 300 may include tempered glass.

Light may be incident onto the upper substrate 300.

The buffer sheet 400 is interposed between the upper substrate 300 and the solar cell panel 200. The buffer sheet 400 protects the solar cell panel 200 from the external physical shock. In addition, the buffer sheet 400 prevents the upper substrate 300 from colliding with the solar cell panel 200.

The buffer sheet 400 may perform an anti-reflective function so that a greater amount of light is incident onto the solar cell panel 200.

The buffer sheet 400 may include resin. The buffer sheet 400 may include various polymer resins. The buffer sheet 400 may include ethylenevinylacetate resin (EVA resin).

The bus bar 500 is provided on the solar cell panel 200. At least a portion of the bus bar may pass through the buffer sheet 400.

The bus bar 500 may include a conductor, and may include copper (Cu).

The bus bar 500 includes a connection part 510, a penetration part 520, and an extension part 530. The connection part 510, the penetration part 520, and the extension part 530 are integrally formed with each other.

The connection part 510 makes contact with the top surfaces of two solar cells and electrically connects the solar cells with each other.

For example, the connection part 510 includes first and second bus bars.

The first bus bar makes contact with the top surface of one of the two solar cells, and the second bus bar makes contact with the top surface of the other of the two solar cells.

The penetration part 520 passes through the buffer sheet 400. The penetration part 520 extends from the connection part 510 and passes through the buffer sheet 400 while extending from the bottom surface thereof to the top surface thereof.

The extension part 530 extends from the penetration part 520 toward the lower portion of the substrate 100. The extension part 530 extends from the top surface of the buffer sheet 400 to the bottom surface of the substrate 100. The extension part 530 may be exposed to the lateral sides of the buffer sheet 400 and the substrate 100. The end of the extension part 530 may be connected to the connector 600.

The bus bar 500 is provided together with the buffer sheet 400 so that the connection part 510 of the bus bar 500 may be bonded to the solar cells through a laminating process. In other words, the buffer sheet 400 and the bus bar 500 may be simultaneously formed in the solar cell module, so that the manufacturing time can be saved.

In addition, the bus bar 500 according to the embodiment may be connected to the connector 600 located on the bottom surface of the lower substrate 100 without forming a hole in the lower substrate 100. Accordingly, the lower substrate 100 can be prevented from being broken due to various factors such as a high temperature in the process of the solar cell module. In addition, a hole machining tool for forming a hole in the lower substrate 100 according to the related art is omitted, so that the manufacturing time and the manufacturing cost can be reduced.

In addition, the buffer sheet 400 can be more firmly sealed together with the lower substrate 100, thereby preventing water from being infiltrated into the solar cell module.

Thereafter, although not shown in drawings, a cable may be further provided. The cable is electrically connected to the solar cell panel 200 through the connector 600 and the bus bar 500. In other words, the cable transfers electrical energy generated from the solar cell panel 200 to a rectifier and/or a battery.

In addition, the cable may be connected to an adjacent solar cell module. In other words, a plurality of solar cell modules may be connected to each other through a cable.

The connector 600 may include a conductor and an insulator, and may be a bypass diode.

The cable may be connected to the connector 600 by a solder paste.

Hereinafter, a method of fabricating the solar cell module according to the embodiment will be described with reference to FIGS. 2 to 5. The details of the parts the same as or similar to the above-described parts will be omitted for the clear and brief description.

The method of fabricating the solar cell module of the embodiment includes a step of forming the solar cell panel 200, a step of forming the buffer sheet 400, and a step of positioning the buffer sheet 400.

Figure 2:
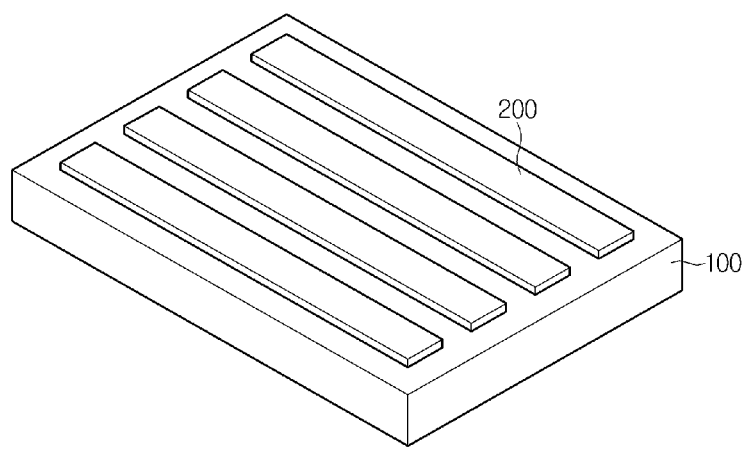
FIGS. 2 to 5 are views showing a method of fabricating the solar cell module according to the embodiment.

Referring to FIG. 2, in the step of forming the solar cell panel 200, the solar cell panel 200 including a plurality of solar cells may be formed on the lower substrate 100.

Thereafter, in the step of forming the buffer sheet 400, the buffer sheet 400 including the bus bar 500 connected to one of the solar cells may be formed.

In detail, the step of forming the buffer sheet 400 includes steps of preparing a mold 10, placing the bus bar 500 on the mold 10, and placing resin 20 on the mold 10.

Figure 3:
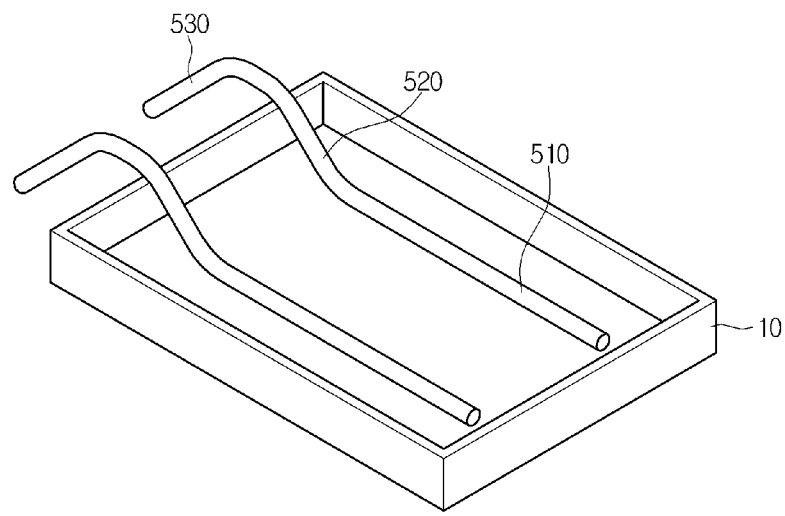

Referring to FIG. 3, the mold 10 may be prepared. In addition, the bus bar 500 may be located on the bottom surface of the mold 10 in the step of placing the bus bar 500 on the mold 10. In this case, the bus bar 500 extends from the bottom surface of the mold 10 so that the bus bar 500 may be exposed to the outside of the mold 10. In detail, the bus bar 500 includes the connection part 510 located on the bottom surface of the mold 10, the penetration part 520 passing through the resin, and the extension part 530 exposed to the outside of the mold 10.

Figure 4:
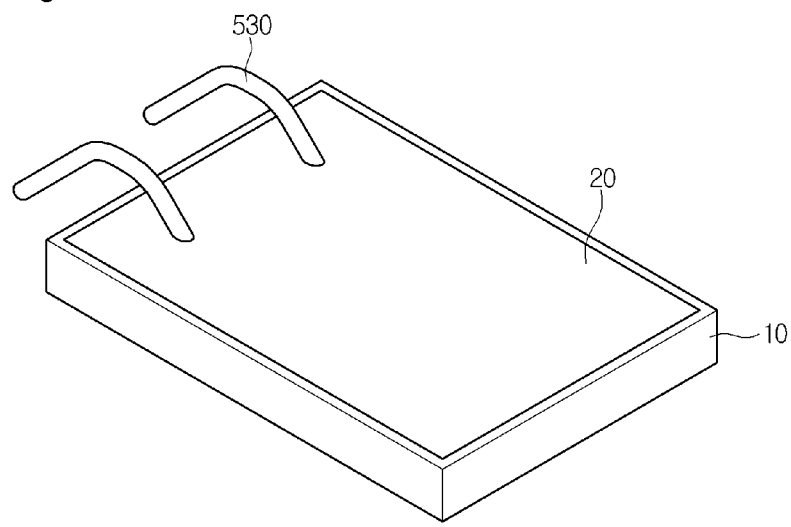

Thereafter, referring to FIG. 4, the resin 20 may be placed on the mold 10. For example, the resin 20 may include EVA resin. Subsequently, the resin 20 may be cured.

Figure 5:
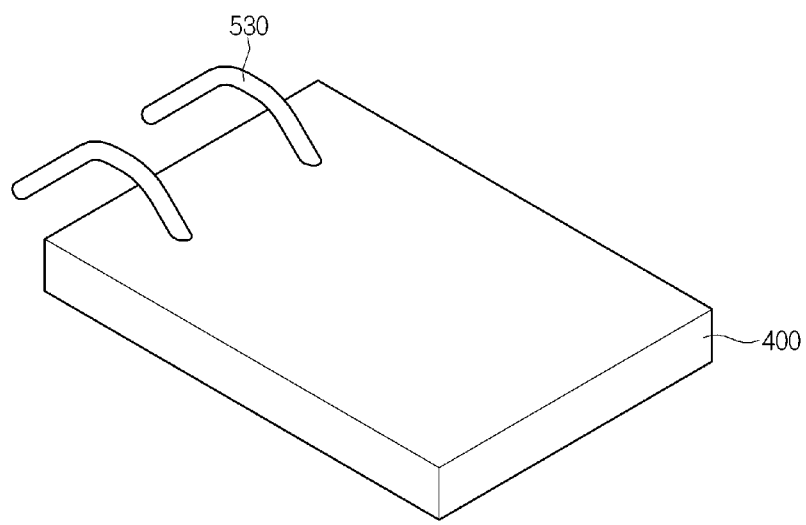

Referring to FIG. 5, if the resin 20 is drawn out of the mold 10, the buffer sheet 400 provided with the bus bar 500 may be fabricated.

Next, in the step of locating the buffer sheet 400, the buffer sheet 400 including the bus bar 500 may be located on the solar cell panel 200. The buffer sheet 400 may be bonded to the bus bar 500 through the laminating process.

Subsequently, after exposing the extension part 530 of the bus bar 500 to the lateral sides of the buffer sheet 400 and the lower substrate 100, the extension part 530 may be connected to the connector 600.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
    a substrate;
    a solar cell panel on the substrate and including a plurality of solar cells;
    a buffer sheet on the solar cell panel, wherein the solar cell panel is positioned between the substrate and the buffer sheet; and
    a bus bar electrically connected to one of the solar cells while passing through the buffer sheet,
    wherein the bus bar comprises a connection part connected to one of the solar cells, a penetration part passing through the buffer sheet, and an extension part extending from the penetration part toward a lower portion of the substrate, and
    wherein the extension part directly makes contact with a top surface of the buffer sheet, a lateral surface of the buffer sheet, a bottom surface of the substrate, and a lateral surface of the substrate.

2. The solar cell module of claim 1, wherein the extension part extends from the top surface of the buffer sheet to the bottom surface of the substrate.

3. The solar cell module of claim 1, further comprising a junction box on a bottom surface of the substrate to electrically connect the solar cell module, wherein an end of the extension part is connected to the junction box.

4. The solar cell module of claim 1, wherein the buffer sheet includes resin.

5. The solar cell module of claim 1, wherein the penetration part passes through the buffer sheet while extending from a bottom surface of the buffer sheet to a top surface of the buffer sheet.

6. The solar cell module of claim 1, wherein the connection part, the penetration part, and the extension part are integrally formed with each other.

7. The solar cell module of claim 1, wherein the connection part of the bus bar is disposed under a bottom surface of the buffer sheet.

8. The solar cell module of claim 1, wherein the connection part of the bus bar is longitudinally parallel to the solar cell panel.

9. The solar cell module of claim 1, wherein the penetration part of the bus bar is vertically overlapped with the solar cell panel.

10. The solar cell module of claim 1, wherein the penetration part of the bus bar is vertically overlapped with the connection part of the bus bar.

11. The solar cell module of claim 1, wherein the penetration part is surrounded by the buffer sheet and directly makes contact with the buffer sheet.

* * * * *